US008099694B1

(12) United States Patent
Chan et al.

(10) Patent No.: US 8,099,694 B1
(45) Date of Patent: Jan. 17, 2012

(54) INTERACTIVE TOOL FOR CONTEMPORANEOUS DESIGN OF INTEGRATED CIRCUITS HAVING DIFFERENT DEVICE PACKAGES

(75) Inventors: Jiunn Wen Chan, Penang (MY); James G. Schleicher, II, Los Gatos, CA (US); Kamal Patel, Campbell, CA (US)

(73) Assignee: Altera Corporation, San Jose, CA (US)

( * ) Notice: Subject to any disclaimer, the term of this patent is extended or adjusted under 35 U.S.C. 154(b) by 276 days.

(21) Appl. No.: 12/424,516

(22) Filed: Apr. 15, 2009

(51) Int. Cl.
*G06F 9/45* (2006.01)

(52) U.S. Cl. ........ 716/103; 716/101; 716/104; 716/106; 716/122

(58) Field of Classification Search .................. 716/101, 716/104, 106, 122
See application file for complete search history.

(56) References Cited

U.S. PATENT DOCUMENTS

| | | | |
|---|---|---|---|
| 6,094,065 A * | 7/2000 | Tavana et al. ................. | 326/39 |
| 6,631,508 B1 * | 10/2003 | Williams ...................... | 716/121 |
| 7,219,311 B2 * | 5/2007 | Koga et al. .................... | 716/103 |
| 7,246,339 B2 * | 7/2007 | Yuan et al. .................... | 716/107 |

* cited by examiner

*Primary Examiner* — Nghia Doan
*Assistant Examiner* — Brian Ngo
(74) *Attorney, Agent, or Firm* — Womble Carlyle Sandridge & Rice, LLP

(57) ABSTRACT

In an example embodiment, an EDA program receives input which includes a selection as to an FPGA die and its device package and a selection as to a structured ASIC die and its device package. If the I/O pins on the device package for the FPGA differ from the I/O pins on the device package for the structured ASIC, the EDA program determines a correspondence between the I/O pins on the two device packages (e.g., by identifying the location of the pads for I/O pins on the structured ASIC die and/or creating a virtual structured ASIC device package whose I/O pins are a superset of the I/O pins on the selected structured ASIC device package), which determination includes checking rules for resource assignments. The EDA program then stores the determined correspondence in a device database where the determined correspondence can be accessed by CAD algorithms.

13 Claims, 6 Drawing Sheets

| HardCopy III Device | HardCopy III Package | FPGA Device |
|---|---|---|
| HC310W[1] | F484 (23 mm) | EP3SL110-F780 |
| HC311W | F484 (23 mm) | EP3SL110-F780 |
| HC311F | F484 (23 mm) | EP3SL110-F780 |
| | | |
| HC320W[1] | F484 (23 mm) | EP3SL150-F780 |
| HC321W | F484 (23 mm) | EP3SL150-F780 |
| HC321F | F484 (23 mm) | EP3SL150-F780 |
| | | |
| HC330W[1] | F484 (23 mm) | EP3SE110-F780 |
| HC331W | F484 (23 mm) | EP3SE110-F780 |
| HC331F | F484 (23 mm) | EP3SE110-F780 |
| | | |
| HC350W[1] | F484 (23 mm) | EP3SL200-H780 |
| HC351W | F484 (23 mm) | EP3SL200-H780 |
| HC351F | F484 (23 mm) | EP3SL200-H780 |
| | | |
| HC360W[1] | F484 (23 mm) | EP3SE260-H780 |
| HC361W | F484 (23 mm) | EP3SE260-H780 |
| HC361F | F484 (23 mm) | EP3SE260-H780 |
| | | |
| HC371W | F484 (23 mm) | EP3SL340-H1152 |
| HC371F | F484 (23 mm) | EP3SL340-H1152 |
| HC371W | F780 (29 mm) | EP3SL340-H1152 |
| HC371F | F780 (29 mm) | EP3SL340-H1152 |

Figure 1

| FPGA Device | HardCopy III Companion Device | HardCopy III Non-Socket Device | Basis for both HardCopy III Device | I/O Pins HC(S3) |
|---|---|---|---|---|
| EP3SL110-F780 |  | HC310WF484 | HA0-W | 296(488) |
| EP3SL110-F780 | HC311WF780 | HC311WF484 | HA1-W | 296(488) |
| EP3SL110-F780 | HC311FF780 | HC311FF484 | HA1-F | 296(488) |
| EP3SL150-F780 |  | HC320WF484 | HA0-W | 296(488) |
| EP3SL150-F780 | HC321WF780 | HC321WF484 | HA1-W | 296(488) |
| EP3SL150-F780 | HC321FF780 | HC321FF484 | HA1-F | 296(488) |
| EP3SE110-F780 |  | HC330WF484 | HA0-W | 296(488) |
| EP3SE110-F780 | HC331WF780 | HC331WF484 | HA1-W | 296(488) |
| EP3SE110-F780 | HC331FF780 | HC331FF484 | HA1-F | 296(488) |
| EP3SL200-F780 |  | HC350WF484 | HA0-W | 296(488) |
| EP3SL200-F780 | HC351WF780 | HC351WF484 | HA1-W | 296(488) |
| EP3SL200-F780 | HC351FF780 | HC351FF484 | HA1-F | 296(488) |
| EP3SE260-H780 |  | HC360WF484 | HA0-W | 296(488) |
| EP3SE260-H780 | HC361WF780 | HC361WF484 | HA1-W | 296(488) |
| EP3SE260-H780 | HC361FF780 | HC361FF484 | HA1-F | 296(488) |
| EP3SL340-H1152 |  | HC371WF484 | HA1-W | 296(744) |
| EP3SL340-H1152 |  | HC371FF484 | HA1-F | 296(744) |
| EP3SL340-H1152 |  | HC371WF780 | HA1-W | 392(744) |
| EP3SL340-H1152 |  | HC371FF780 | HA1-F | 488(744) |

Figure 2

INTERACTIVE TOOL FOR CONTEMPORANEOUS DESIGN OF INTEGRATED CIRCUITS HAVING DIFFERENT DEVICE PACKAGES

BACKGROUND

An engineer designing an integrated circuit can choose from a number of target devices. Two commonly chosen target devices are application-specific integrated circuits (ASICs) and field programmable gate arrays (FPGAs). Typically, ASICs offer better density, performance, and power than FPGAs but require large non-recurring engineering (NRE) costs. FPGAs have much lower NRE costs, but a higher unit cost. So for larger quantities of production, it makes economic sense to produce ASICs rather than FPGAs.

A structured ASIC (or neo-gate-array) is a target device that combines the flexibility of an FPGA with the efficiency of an ASIC. A structured ASIC ordinarily consists of a base array of hard blocks (e.g., I/O and RAM) along with relatively simple logic structures in a regular fabric that is hard-wired for most processing layers, but which can be targeted to a specific application by customizing several (e.g., two to four) metal or via layers. As the technology for structured ASICs has become more mature, a design flow that mitigates risk has emerged which involves the prototyping, testing, and initial shipment of a design using an FPGA and then the migration of that design to a structured ASIC or custom (e.g., full-custom) ASIC for volume production.

Altera Corporation has developed an application program in the field of electronic design automation (EDA) called Quartus®. Among other things, some implementations of Quartus® facilitate the migration between devices (e.g., by constraining the design of the source and/or target device and/or its package) with different resource densities when the devices are in the same family and fit on the same package (e.g., ball grid array). This sort of migration is sometimes referred to as "vertical migration". Such devices can use the same printed circuit board (PCB). Some implementations of Quartus® also facilitate the migration between devices with different resource densities when the devices are in the same family and the smaller device's resources are a subset of the larger device's resources. This sort of migration is sometimes referred to as "SameFrame migration". Here again such devices can use the same PCB. Finally in this regard, some implementations of Quartus® facilitate the migration from a design (e.g., die and device package combination) for an FPGA and to a design (e.g., die and device package combination) for a structured ASIC, when the FPGA and the structured ASIC fit onto the same device package and therefore the same PCB. This sort of migration is sometimes referred to as "HardCopy® migration", where HardCopy® is the name of a structured ASIC developed by Altera Corporation.

As logic (or IP) cores have become smaller, the cost of the device package has increased as a percent of the total cost of a device. Consequently, there exists a need for functionality to facilitate the migration from an FPGA design to a structured ASIC or custom ASIC design that uses a device package that is smaller than the device package used by the FPGA design. The inventions described below include such functionality, along with additional functionality which is widely applicable to this and other fields.

SUMMARY

In an example embodiment, an EDA program receives user input which includes: (1) a selection as to an FPGA die (or other integrated circuit) and a device package into which the FPGA die fits; and (2) a selection as to a structured ASIC die (or other integrated circuit) and a device package into which the structured ASIC fits. If the resources (e.g., I/O pins) on the device package for the FPGA differ from the resources on the device package for the structured ASIC, the EDA program determines a correspondence between the resources on the two device packages (e.g., by identifying the location of the pads or electrical contacts for I/O pins on the structured ASIC die). In an example embodiment, the correspondence determination includes checking rules for resource assignments. The EDA program stores the determined correspondence in a device database where it can be accessed by the EDA program's CAD (computer-aided design) algorithms related to such tasks as automatic pin assignment, legality checking of pin assignments, etc. In an example embodiment, the EDA program might display to the user a GUI view which depicts the resources (e.g., I/O pins) available for selection in the device package for the FPGA, where availability of a resource depends upon the determined correspondence. In this way, the EDA program facilitates the contemporaneous design of an FPGA die which (a) will fit onto the selected device package for the FPGA and (b) can be easily migrated to the selected structured ASIC die and its device package without further design with respect to device-package resources (e.g., I/O pins). As suggested above, the EDA program might also facilitate the contemporaneous design of a structured ASIC die which (a) will fit onto the selected device package for the structured ASIC and (b) can be easily migrated to a selected FPGA die and its device package.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood from the following detailed description when read in conjunction with the accompanying drawings.

FIG. 1 is a table whose rows show particular integrated circuits that might be contemporaneously designed by a user of an EDA program, in accordance with an example embodiment.

FIG. 2 is a table whose rows show the difference in the number of I/O pins between FPGAs and structured ASICs that might be contemporaneously designed by a user of an EDA program, in accordance with an example embodiment.

DETAILED DESCRIPTION

Figure 3:
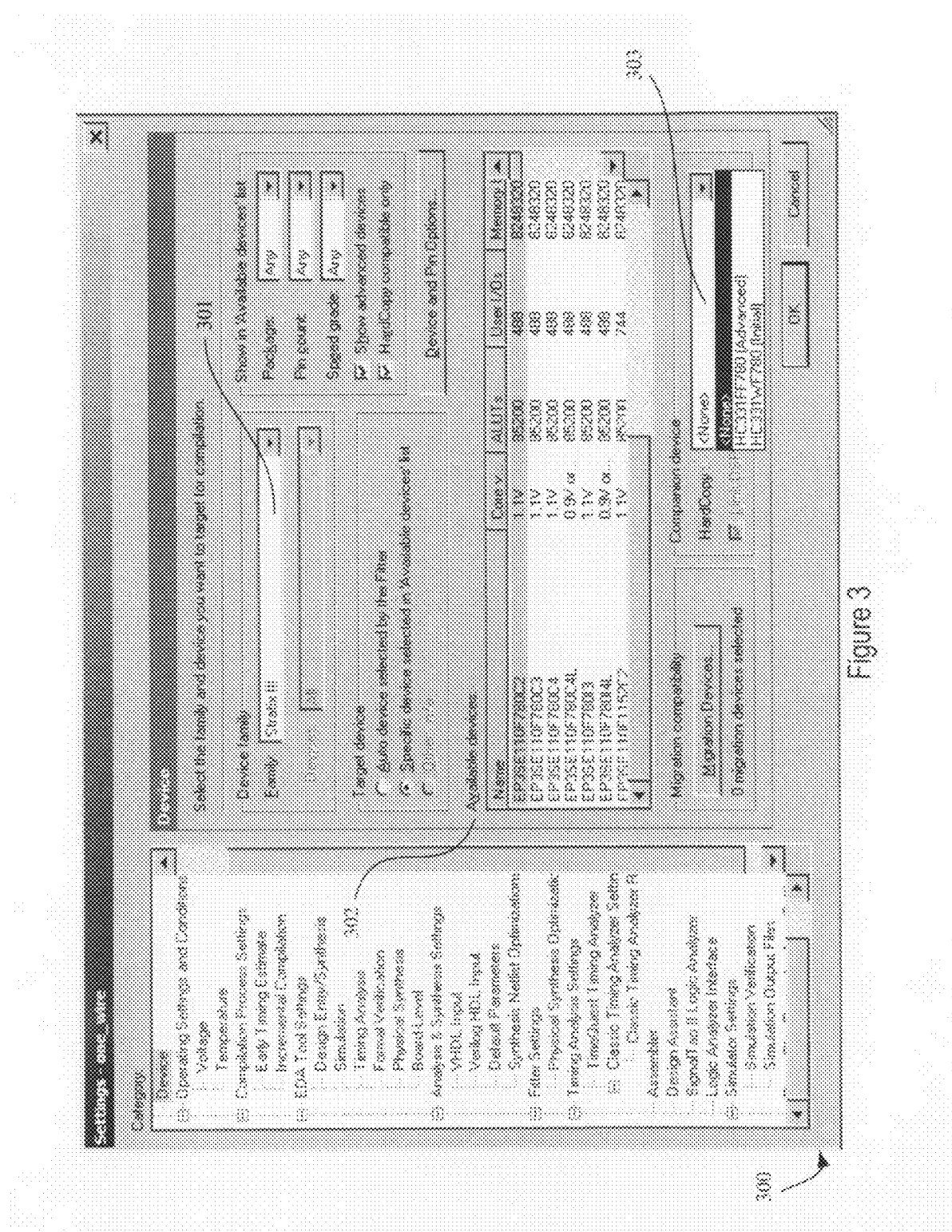
FIG. 3 is a view in an EDA program's graphical user interface (GUI) that allows the user to select a structured ASIC that might be contemporaneously designed with an FPGA, in accordance with an example embodiment.

In the following description, numerous specific details are set forth in order to provide a thorough understanding of the example embodiments. However, it will be apparent to one skilled in the art that the example embodiments may be practiced without some of these specific details. In other instances, process operations and implementation details have not been described in detail, if already well known in the art.

FIG. 1 is a table whose rows show particular integrated circuits that might be contemporaneously designed by a user of an EDA program, in accordance with an example embodiment. For example, the entries in the second row indicate that a structured ASIC device (e.g., a HardCopy® III device) whose product number is HC311W corresponds to a device package (e.g., a ball grid array) whose product number is F484. Further, the entries in the second row indicate that this structured ASIC device and this device package might be contemporaneously designed (e.g., by a Quartus® user) with an FPGA device whose product number is EP3SL110-F780, where F780 is a sub-product number that identifies the device package for the FPGA.

FIG. 2 is a table whose rows show the difference in the number of I/O pins between FPGA dies and structured ASIC dies that might be contemporaneously designed by a user of an EDA program, in accordance with an example embodiment. For example, the entries in the second row indicate that an FPGA device whose product number is EP3SL110 (and whose device package has a product number of F780) has 488 I/O pins whereas the structured ASIC device whose product number is HC311WF484, has only 296 I/O pins. (Here it will be appreciated that "HC" is an abbreviation for HardCopy® and "S3" is an abbreviation for Stratix III, a family of FPGAs produced by Altera Corporation.) It will be appreciated that if this FPGA device (e.g., a die and device package combination) and this structured ASIC device (e.g., a die and device package combination) are to be contemporaneously designed, the smaller number of I/O pins in the structured ASIC device will constrain the design of the FPGA device's I/O pins.

The entries in the second row also indicate that the FPGA identified in the first column (e.g., EP3SL110-F780) has a "companion device" which is a structured ASIC device whose product number is HC311WF780. It will be appreciated that "F780" is a sub-product number that identifies the device package for this structured ASIC and that the FPGA identified in the first column has the same sub-product number and, consequently, the same device package. Therefore, this structured ASIC and this FPGA can use the same PCB. This structured ASIC device (e.g., HC311WF780) and the structured ASIC in the third column (e.g., HC311WF484) can use the same die, e.g., the die identified by product number HA1-W in the fourth column of the second row, though the two structured ASICs fit onto different device packages, e.g. F780 and F484, respectively. The "companion device" in the second column (e.g., HC311WF780) might result from a migration from an FPGA die to a structured ASIC die that fits on the same device package as the FPGA as described in Mike Hutton et al., *A Methodology for FPGA to Structured-ASIC Synthesis and Verification*, Design and Test in Europe (Vol. 2, 2006), pp. 1-6, which is incorporated herein by reference. As shown in the first row in the table, some FPGAs in the table do not have companion devices that fit on the same device package. The absence of a companion device does not prevent the contemporaneous design of an FPGA and structured ASIC, since a virtual (or logical rather than physical) companion device package might be created.

FIG. 3 is a view in an EDA program's graphical user interface (GUI) that allows the user to select a structured ASIC that might be contemporaneously designed with an FPGA, in accordance with an example embodiment. It will be appreciated that the GUI view in this figure is displayed by Altera Corporation's Quartus®, though a similar GUI view might be displayed by another EDA program, in other example embodiments. As shown in the figure, a view 300 includes a dropdown menu 301 which allows the user to select a device family for an FPGA, e.g., the Stratix III (e.g., S3) family of FPGAs. The available devices in this family are listed in a table 302, in which the first row is highlighted to indicate its selection by the user. Most of the devices in the family have product numbers indicating that the device package is F780 with 488 I/O pins available to the user, although this is not true of the FPGA in the last visible row. That FPGA has 744 I/O pins available to the user. View 300 also includes a dropdown menu 303 which allows the user to select a companion device, e.g., a structured ASIC (e.g., HC331FF780 or HC331WF780) whose die fits into the same device package as the selected FPGA die (e.g., the die in the FPGA whose product number is EP3SE110F780C2). In an example embodiment, this dropdown menu might be extended to include one or more structured ASICs which are not companion devices (e.g., each of their dies do not fit onto the same device package as the selected FPGA die). It will be appreciated that a similar view might allow the user to select a structured ASIC that might be contemporaneously designed with an FPGA so that the structured ASIC can be easily migrated to the FPGA.

Figure 4A:
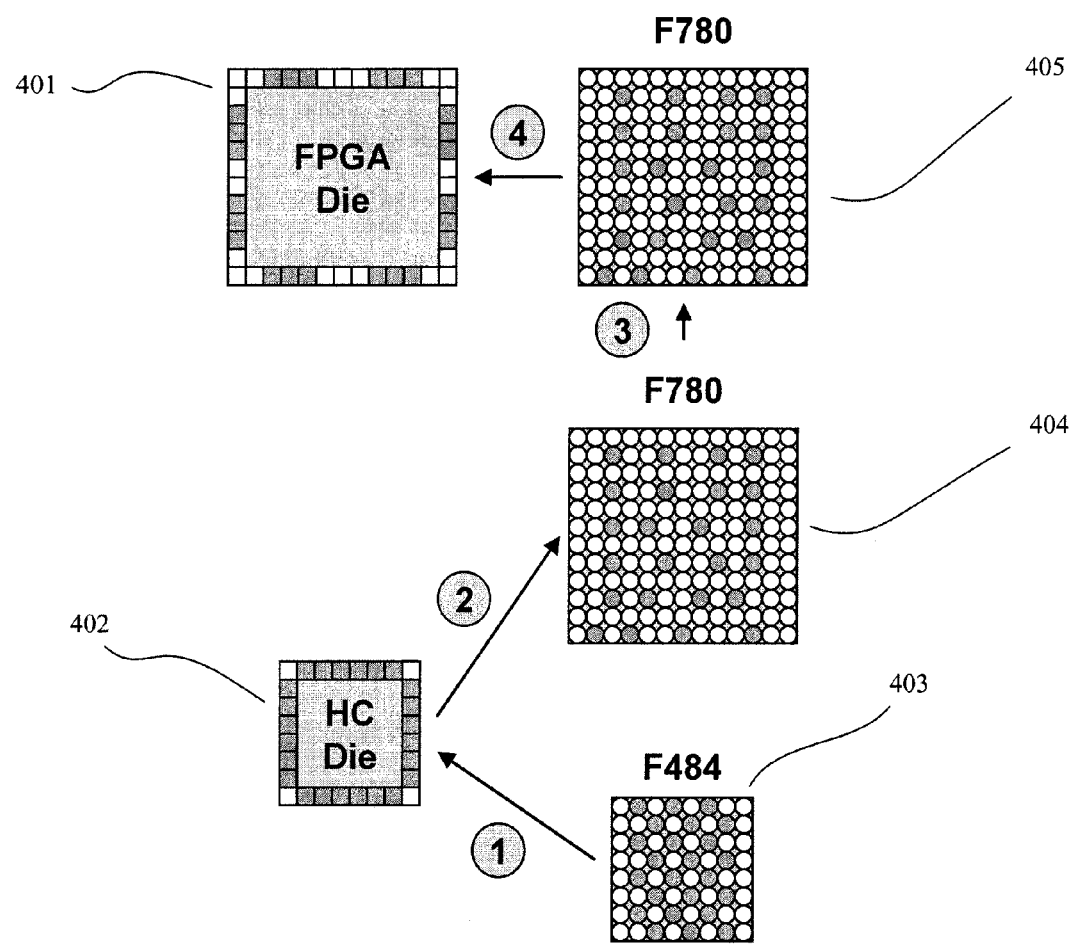
FIG. 4A is a schematic diagram showing a process which an EDA program might use to determine the available pins in an FPGA being contemporaneously designed with a structured ASIC, in accordance with an example embodiment.

FIG. 4A is a schematic diagram showing a process which an EDA program might use to determine the available pins in an FPGA being contemporaneously designed with a structured ASIC, in accordance with an example embodiment. This figure assumes that a user of the EDA program has selected two dies for contemporaneous design, an FPGA die 401 and an HC (HardCopy® structured ASIC) die 402. Associated with the HC die 402 is a device package 403, identified by product number is F484. Associated with FPGA die 401 is a device package 405, identified by product number F780. Device package 404 might be associated with another structured ASIC device (e.g., a companion device as described above) or might be a virtual device package whose pins are a superset of the pins on the selected structured ASIC package (e.g., device package 403). As indicated in the figure and in the discussion above regarding FIG. 2, HC die 402 can fit onto the device package 404, as well as onto the device package 403. It will be appreciated that the device packages 403, 404, and 405 are depicted as ball grid arrays in this figure, where some or all of the "balls" in the ball grid array might represent I/O pins. However, in other example embodiments, the device packages might employ a type of surface-mount technology (SMT) other than a ball grid array. It will also be appreciated that the device package impacts other aspects of the overall design of a device, insofar as the device package typically fits onto a PCB whose electrical contacts match up with the electrical contacts on the device package.

In the first operation (1) of the process, the EDA program determines which I/O pins are available on the device package 403. Then in the process's second operation (2), the EDA program identifies which pads on the HC die 402 correspond to these available I/O pins and which I/O pins in the device package 404 correspond to these pads. In an example embodiment, the I/O pins in the device package 404 can be a superset of the I/O pins in the device package 403. Then in the process's third operation (3), the EDA program determines which available I/O pins on the device package 405 correspond to the identified I/O pins on device package 404. In an example embodiment, the device packages 404 and 405 might be the same device package, though the available I/O pins on device package 405 might differ from the identified I/O pins on the device package 404 since the device package 404 is associated with an HC (or structured ASIC) die and the device package 405 is associated with an FPGA die, e.g., FPGA die 401. In the process's fourth operation (4), the EDA program displays or otherwise communicates to the user of the EDA program the I/O pins on the device package 405 which are available for use with the pads on the FPGA die 401. Additionally, the EDA program might store or update the data relating to the available I/O pins on the device package 405 in a device database where it can be accessed by the EDA program's CAD algorithms related to such tasks as automatic pin assignment, legality checking of pin assignments, etc.

It will be appreciated that the processes described above and below facilitate the design of an FPGA die which (a) will fit onto the selected device package for the FPGA and (b) can be easily migrated (e.g., following debugging) to the selected structured ASIC die and its device package without further design with respect to I/O pins. Further, it will be appreciated that the processes described above and below are equally applicable to resources on a device package other than I/O pins, for example, resources such as the locations of Positive supply voltages (e.g., VCCs) and the locations of negative supply voltages (e.g., GNDs).

Figure 4B:
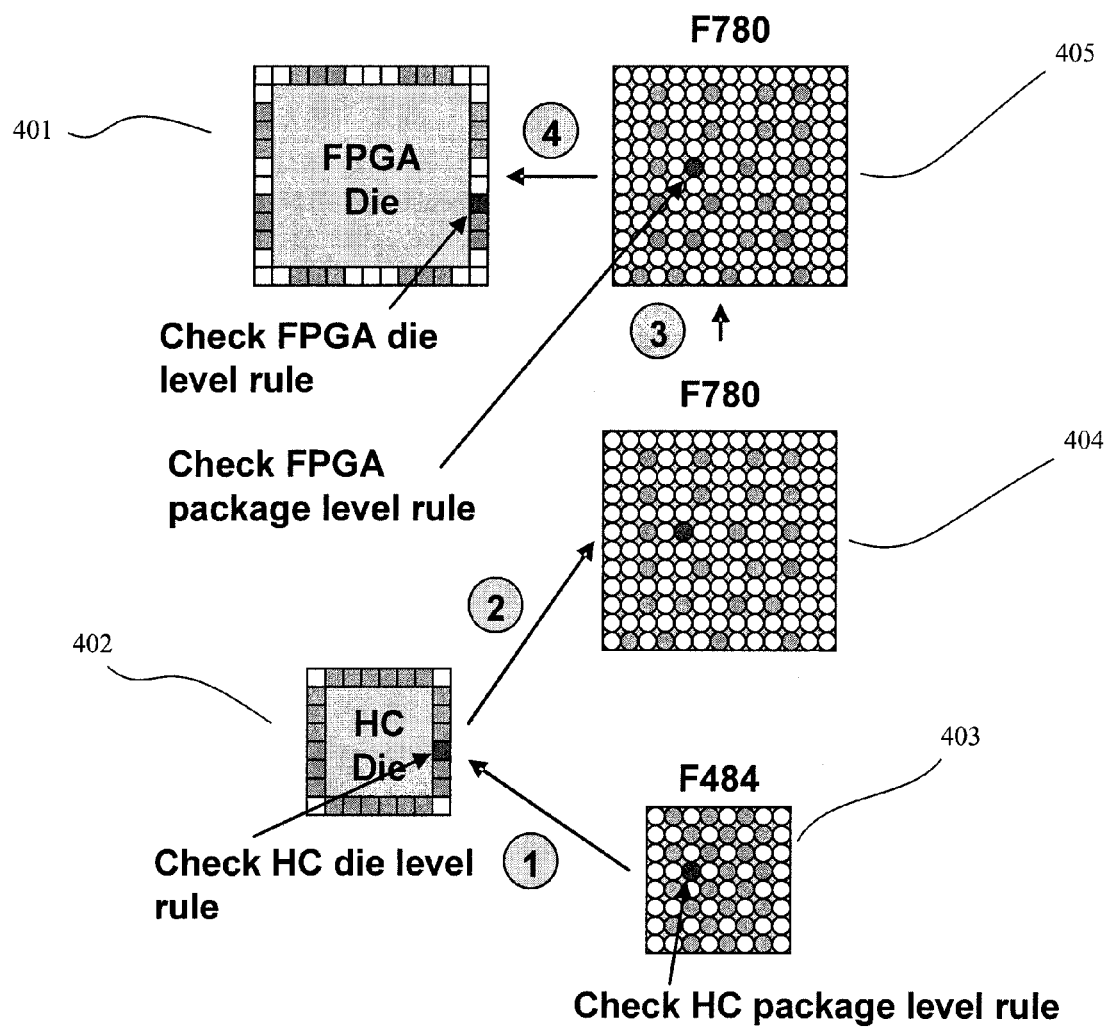
FIG. 4B is a schematic diagram showing the rule-checking associated with a process which an EDA program might use to determine the available pins in an FPGA being contemporaneously designed with a structured ASIC, in accordance with an example embodiment.

FIG. 4B is a schematic diagram showing the rule-checking associated with a process which an EDA program might use to determine the available pins in an FPGA being contemporaneously designed with a structured ASIC, in accordance with an example embodiment. As with FIG. 4A, FIG. 4B assumes that a user of the EDA program has selected two dies for contemporaneous design, an FPGA die 401 and an HC (HardCopy® structured ASIC) die 402. Associated with the HC die 402 is a device package 403, identified by product number is F484. Associated with FPGA die 401 is a device package 405, identified by product number F780. As above, device package 404 might be associated with another structured ASIC device (e.g., a companion device) or might be a virtual device package whose pins are a superset of the pins on the selected structured ASIC package 403. As indicated in the figure, HC die 402 can fit onto the device package 404, as well as onto the device package 403. As indicated above, the I/O pins in the device package 404 can be a superset of the I/O pins in the device package 403.

In the first operation (1) of the process, the EDA program determines which I/O pins are available on the device package 403. Then in the process's second operation (2), the EDA program identifies which pads on the HC die 402 correspond to these available I/O pins and which I/O pins in the device package 404 correspond to these pads. As indicated in FIG. 4B, both the first and second operations involve checking rules applicable to the HC die 402 and its device package 403. An example of such a rule is that an HC die and its device package cannot support OCT (on-chip termination) which is "Rt" (or parallel). See generally, U.S. Pat. No. 7,420,386. The rule might be stored in a device database, in an example embodiment, or alternatively, in a separate (e.g., rules) database.

Then in the process's third operation (3), the EDA program determines which available I/O pins on the device package 405 correspond to the identified I/O pins on device package 404. In an example embodiment, the device packages 404 and 405 might be the same device package, though the available I/O pins on device package 405 might differ from the identified I/O pins on the device package 404 since the device package 404 is associated with an HC (or structured ASIC) die and the device package 405 is associated with an FPGA die, e.g., FPGA die 401. In the process's fourth operation (4), the EDA program displays or otherwise communicates to the user of the EDA program the I/O pins on the device package 405 which are available for use with the pads on the FPGA die 401. Additionally, in the fourth operation, the EDA program might store or update the data underlying the determination of and relating to the available I/O pins on the device package 405 in a device database where it can be accessed by the EDA program's CAD algorithms related to such tasks as automatic pin assignment, legality checking of pin assignments, including the automatic pin assignments and the legality checking of pin assignments involved in the operations of the process described in FIG. 4B.

As indicated in FIG. 4B, both the third and fourth operations involve checking rules applicable to the FPGA die 401 and its device package 405. An example of such a rule is that a LVDS RX (low-voltage differential signaling receiver) and half-rate DDR (double-data rate SDRAM) cannot be mixed in the same row on an FPGA.

Figure 5:
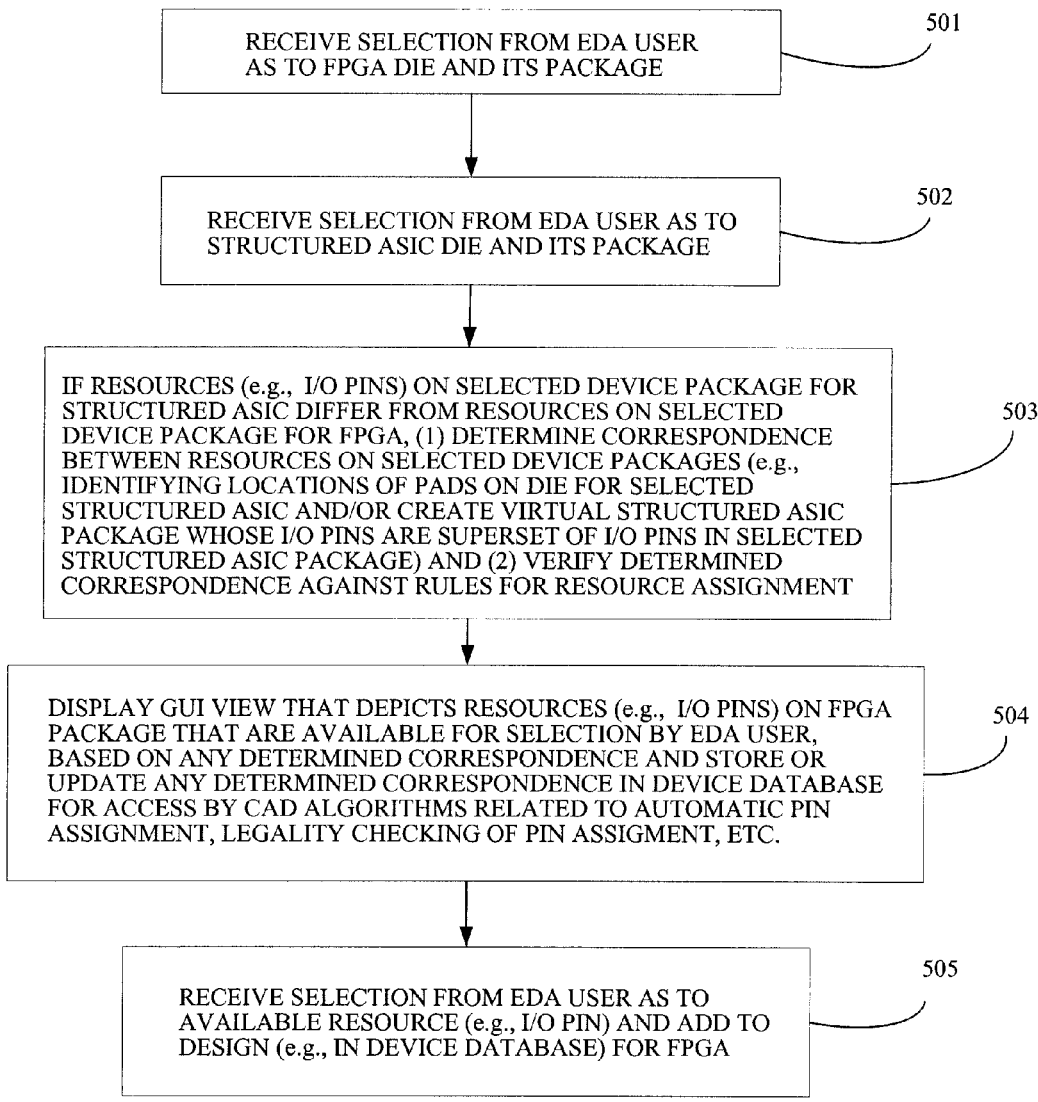
FIG. 5 is a simplified flowchart diagram showing a process for the contemporaneous design of an FPGA and a structured ASIC, in accordance with an example embodiment.

FIG. 5 is a simplified flowchart diagram showing a process for the contemporaneous design of an FPGA and a structured ASIC, in accordance with an example embodiment. In the process' first operation 501, an EDA program receives a selection from a user as to an FPGA die and its device package. In operation 502 of the process, the EDA program receives a selection from a user as to a structured ASIC (e.g., HardCopy®) die and its device package. Then if the resources (e.g., I/O pins) on the selected device package for the structured ASIC differ from the resources on the selected device package for the FPGA, the EDA program determines a correspondence between the resources on the selected device packages, in operation 503 of the process. As noted earlier, this determination might involve identifying the locations of the pads or electrical contacts in the selected structured ASIC die and the creation of a virtual (or logical) structured ASIC package whose pins are a superset of the pins on the selected structured ASIC package. This operation might also involve verifying a resource (e.g., I/O pin) assignment against one or more rules governing the legality (e.g., in terms of a properly performing design) stored in a device database or a separate (e.g., rules) database. In a particular example embodiment, this determination might be made at an earlier point in time for a number of structured ASIC and FPGA pairs (e.g., the pair shown in first row of the table in FIG. 2) and stored in a database for expedient reference by the EDA program. In operation 504 of the process, the EDA program displays a GUI view that depicts the resources (e.g., I/O pins) on the FPGA device package that are available for selection by the EDA user, based on any correspondence as determined in operation 503. Additionally, the EDA program might store or update the data relating to the determined correspondence or the available I/O pins on the device package 405 in a device database where it can be accessed by the EDA program's CAD algorithms related to such tasks as automatic pin assignment, legality checking of a pin assignment, etc. Then in operation 505 of the process, the EDA program receives a selection from the EDA user as to an available resource (e.g., I/O pin) and adds it to the design (e.g., data structure in a device database) for the FPGA. The user of the EDA program can then compile the design for the FPGA device (e.g., die and device package combination) and debug the design before migrating it to the selected structured ASIC device.

Although the foregoing example embodiments have been described in some detail for purposes of clarity of understanding, it will be apparent that certain changes and modifications may be practiced within the scope of the appended claims. The example embodiments described above involve the contemporaneous design of an FPGA and a structured ASIC.

However, it will be appreciated that those example embodiments apply with equal force if the integrated circuits to be contemporaneously designed are an FPGA and a custom ASIC, two FPGAs, two structured ASICs, two custom ASICS, etc. Accordingly, the example embodiments are to be considered as illustrative and not restrictive. And the invention is not to be limited to the details given herein, but may be modified within the scope and equivalents of the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

What is claimed is:

1. A method, comprising:
   receiving input that includes a selection as to a first device package for a first integrated circuit and a selection as to a second device package for a second integrated circuit and wherein resources on the first device package differ from resources on the second device package;
   determining a correspondence between the resources on the first device package and the resources on the second device package, wherein the determining includes verifying resource assignments received as input against rules regarding legality of resource assignments; and
   storing the determined correspondence in a device database, wherein the resources on the first and the second device packages include input/output pins and the correspondence constrains the resources on the second device package which are available for selection, wherein the determining includes creating at least a partial design for a virtual device package with input/output pins, wherein the input/output pins in the virtual device package are a superset of the input/output pins on the first device package, and wherein at least one method operation is executed by a processor.

2. The method of claim 1, wherein the stored determined correspondence becomes an input for a CAD task selected from a group consisting of automatic resource assignment, legality checking of a resource assignment, and visual depiction of available resources for assignment.

3. The method of claim 1, wherein the correspondence depends at least in part upon a location of one or more pads on the first integrated circuit and wherein the availability of an input/output pin is based at least in part upon the correspondence.

4. The method of claim 1, further comprising receiving a selection of an available input/output pin in the second device package and adding the selection to a data structure for a design of the second integrated circuit.

5. The method of claim 1, wherein the first integrated circuit is an application-specific integrated circuit and the second integrated circuit is a field programmable gate array and wherein the pins for input/output differ between the application-specific integrated circuit and the field programmable gate array.

6. The method of claim 5, wherein the method is used by a tool that facilitates migration of the field programmable gate array to the application-specific integrated circuit.

7. Software encoded in one or more computer-readable media that is non-transitory and when executed by a processor, operable to:
   receive input that includes a selection as to a first device package for a first integrated circuit and a selection as to a second device package for a second integrated circuit and wherein resources on the first device package differ from resources on the second device package;
   determine a correspondence between the resources on the first device package and the resources on the second device package, wherein the determining includes verifying any resource assignments received as input against rules regarding legality of resource assignments; and
   store the determined correspondence in a device database, wherein the resources include pins for input/output and the correspondence constrains the resources on the second device package which are available for selection, wherein the determining includes creating at least a partial design for a virtual device package with pins for input/output, and wherein the pins for input/output in the virtual device package are a superset of the pins for input/output on the device package for the first integrated circuit.

8. The software of claim 7, wherein the stored determined correspondence becomes an input for a CAD task selected from the group consisting of automatic resource assignment, legality checking of a resource assignment, and visual depiction of available resources for assignment.

9. The software of claim 7, wherein the correspondence depends at least in part upon a location of one or more pads on the first integrated circuit and wherein the availability of an input/output pin is based at least in part upon the correspondence.

10. The software of claim 7, further comprising software operable to receive a selection of an available input/output pin in the second device package and add the selection to a data structure for a design of the second integrated circuit.

11. The software of claim 7, wherein the first integrated circuit is an application-specific integrated circuit and the second integrated circuit is a field programmable gate array and wherein the pins for input/output differ between the application-specific integrated circuit and the field programmable gate array.

12. The software of claim 7, wherein the software facilitates the migration of the field programmable gate array to the application-specific integrated circuit.

13. A method, comprising:
receiving a selection of a field programmable gate array and an associated device package;
receiving a selection of a structured application-specific integrated circuit and an associated device package;
determining a correspondence between the two device packages based at least in part on a plurality of electrical contacts in the device package associated with the field programmable gate array and in the device package associated with the structured application-specific integrated circuit, wherein the determining includes verifying resource assignments received as input against rules regarding legality of resource assignments;
compiling the field programmable gate array based at least in part on the correspondence, wherein the field programmable gate array as compiled is configured to fit the device package associated with the field programmable gate array;
and
compiling the structured application-specific integrated circuit, wherein the structured application-specific integrated circuit as compiled is configured to fit the device package associated with structured application-specific integrated circuit, wherein the resources include input/output pins , wherein the determining includes creating at least a partial design for a virtual device package with input/output pins, wherein the input/output pins in the virtual device package are a superset of the input/output pins on the device package for the structured application-specific integrated circuit, and wherein at least one method operation is is executed by a processor.

* * * * *